United States Patent
Divakaruni et al.

(10) Patent No.: US 6,759,291 B2
(45) Date of Patent: Jul. 6, 2004

(54) SELF-ALIGNED NEAR SURFACE STRAP FOR HIGH DENSITY TRENCH DRAMS

(75) Inventors: Ramachandra Divakaruni, Somers, NY (US); Jochen Beintner, Wappingers Falls, NY (US); Jack A. Mandelman, Stormville, NY (US); Ulrike Gruening, Munich (DE); Johann Alsmeier, Wappingers Falls, NY (US); Gary Bronner, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 10/045,499

(22) Filed: Jan. 14, 2002

(65) Prior Publication Data

US 2002/0079528 A1 Jun. 27, 2002

Related U.S. Application Data

(62) Division of application No. 09/603,657, filed on Jun. 23, 2000, now Pat. No. 6,369,419.

(51) Int. Cl.$^7$ .......................................... H01L 21/8234
(52) U.S. Cl. ........................ 438/238; 438/243; 438/386
(58) Field of Search ............................... 438/238, 243, 438/244, 245, 386, 387, 388

(56) References Cited

U.S. PATENT DOCUMENTS

| | | | |
|---|---|---|---|
| 5,065,273 A | 11/1991 | Rajeevakumar | 361/313 |
| 5,360,758 A | 11/1994 | Bronner et al. | 438/243 |
| 5,670,805 A | 9/1997 | Hammerl et al. | 257/301 |
| 5,719,080 A | 2/1998 | Kenney | 438/243 |
| 5,770,876 A | 6/1998 | Lam et al. | 257/301 |
| 5,780,335 A | 7/1998 | Henkels et al. | 438/243 |
| 5,827,765 A | 10/1998 | Stengl et al. | 438/243 |
| 5,874,758 A | 2/1999 | DeBrosse | 257/301 |
| 5,909,044 A | 6/1999 | Chakravarti et al. | 257/301 |
| 5,923,971 A | 7/1999 | Ho et al. | 438/245 |
| 5,943,581 A | 8/1999 | Lu et al. | 438/243 |
| 5,953,607 A | 9/1999 | Hakey et al. | 438/249 |
| 5,998,254 A * | 12/1999 | Heineck | 438/243 |
| 6,063,657 A * | 5/2000 | Bronner et al. | 438/243 |
| 6,090,660 A * | 7/2000 | Noble, Jr. | 438/243 |
| 6,291,286 B1 * | 9/2001 | Hsiao | 438/238 |

\* cited by examiner

Primary Examiner—Michael Trinh
(74) Attorney, Agent, or Firm—McGinn & Gibb, PLLC; Ira D. Blecker, Esq.

(57) ABSTRACT

A method and structure for a dynamic random access memory device comprising a storage trench, a storage conductor within the storage trench, a lip strap connected to the storage conductor, and a control device electrically connected to the storage conductor through the lip strap. The trench contains a corner adjacent the control device and the lip strap and has a conductor surrounding the corner. The control device has a control device conductive region adjacent the trench and the lip strap and has a conductor extending along a side of the trench and along a portion of the control device conductive region. In addition, the device can have a collar insulator along a top portion of the trench, wherein the lip strap includes a conductor extending from a top of the collar to a top of the trench. The lip strap can also extend along a surface of the device adjacent the trench and perpendicular to the trench. A node dielectric, lining the trench where the lip strap surrounds an upper portion of the node dielectric, is adjacent the top portion of the trench and can have a trench top oxide where the lip strap extends into the trench top oxide and forms an inverted U-shaped structure. Further, the lip strap can include a conductor extending along two perpendicular portions of a top corner of the trench.

20 Claims, 9 Drawing Sheets

SELF-ALIGNED NEAR SURFACE STRAP FOR HIGH DENSITY TRENCH DRAMS

CROSS-REFERENCE TO RELATED APPLICATIONS

This application is a division of U.S. application Ser. No. 09/603,657 filed Jun. 23, 2000 now U.S. Pat. No. 6,369,419.

BACKGROUND OF THE INVENTION

1. Field of the Invention

The present invention generally relates to conductive straps utilized to connect storage devices to transistors and more particularly to self-aligned near surface straps for high density trench storage devices.

2. Description of the Related Art

Conventional systems for processing trench dynamic random access memory (DRAM) structures form a buried strap by performing two recess steps and etching the collar after the first of these recesses. The second recess provides margin for a dielectric on top of the trench to isolate it from the passing wordline. In this scheme, the buried strap depth (determined by the sum of the first recess and collar wet etch) cannot be made very shallow and is thus not scalable from standard device scaling rules, which as is well known in the art, require shallow junctions. Secondly, the difference in two recess depths combined with the required presence of a thin interface (to prevent dislocations) places severe constraints on the tolerance of the resistance contributed by the buried strap.

Several suggestions have been made to ameliorate some of the problems mentioned above including methods to form the buried strap after active area (AA) definition (which adds considerable cost), a divot strap (which can cause a large pad oxide undercut), and a surface strap (which places considerable pressure on isolation planarization). Therefore, there is a need for a strap that allows better control of the leakage of current from the capacitor and is thus much more scalable.

SUMMARY OF THE INVENTION

It is, therefore, an object of the present invention to provide a structure and method for a dynamic random access memory device comprising a storage trench, a storage conductor within the storage trench, a lip strap connected to the storage conductor, and a control device electrically connected to the storage conductor through the lip strap. The trench contains a corner adjacent the control device and the lip strap and has a conductor surrounding the corner. The control device has a control device conductive region adjacent the trench and the lip strap and has a conductor extending along a side of the trench and along a portion of the control device conductive region. In addition, the device can have a collar insulator along a top portion of the trench, wherein the lip strap includes a conductor extending from a top of the collar to a top of the trench. The lip strap can also extend along a surface of the device adjacent the trench and perpendicular to the trench. A node dielectric, lining the trench where the lip strap surrounds an upper portion of the node dielectric, is adjacent the top portion of the trench and can have a trench top oxide where the lip strap extends into the trench top oxide and forms an inverted U-shaped structure. Further, the lip strap can include a conductor extending along two perpendicular portions of a top corner of the trench.

The invention further includes a method of forming a dynamic random access memory structure for forming a trench within a substrate, filling the trench with a trench conductor, forming a pad oxide along a surface of the substrate adjacent the trench, forming a collar along an upper portion of the trench such that the collar insulates the substrate from the trench conductor, recessing the collar and the pad oxide, depositing a lip strap over the trench conductor and in recesses produced by the recessing, and forming an isolation region adjacent the lip strap.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

This invention comprises a method and structure relating to conductive straps utilized to connect storage devices to transistors and more particularly to self-aligned near surface straps for high density trench storage devices, the structure is referred to herein as a near surface or 'lip' strap. The near surface strap is used in the DRAM structures of semiconductor chips or devices and replaces the conventional buried strap that is typically used with DRAM structures.

The inventive near surface strap provides an electrical connection between a conductor or capacitor in the trench of a DRAM structure and the active devices on the semiconductor chip. While this disclosure will make obvious to those skilled in art other advantages, one benefit of the invention is the formation of a connection between the strap and the conductor that is at the surface of the semiconductor device. This surface connection allows better control of leakage current and, as a result, is much more scalable.

Figure 1:
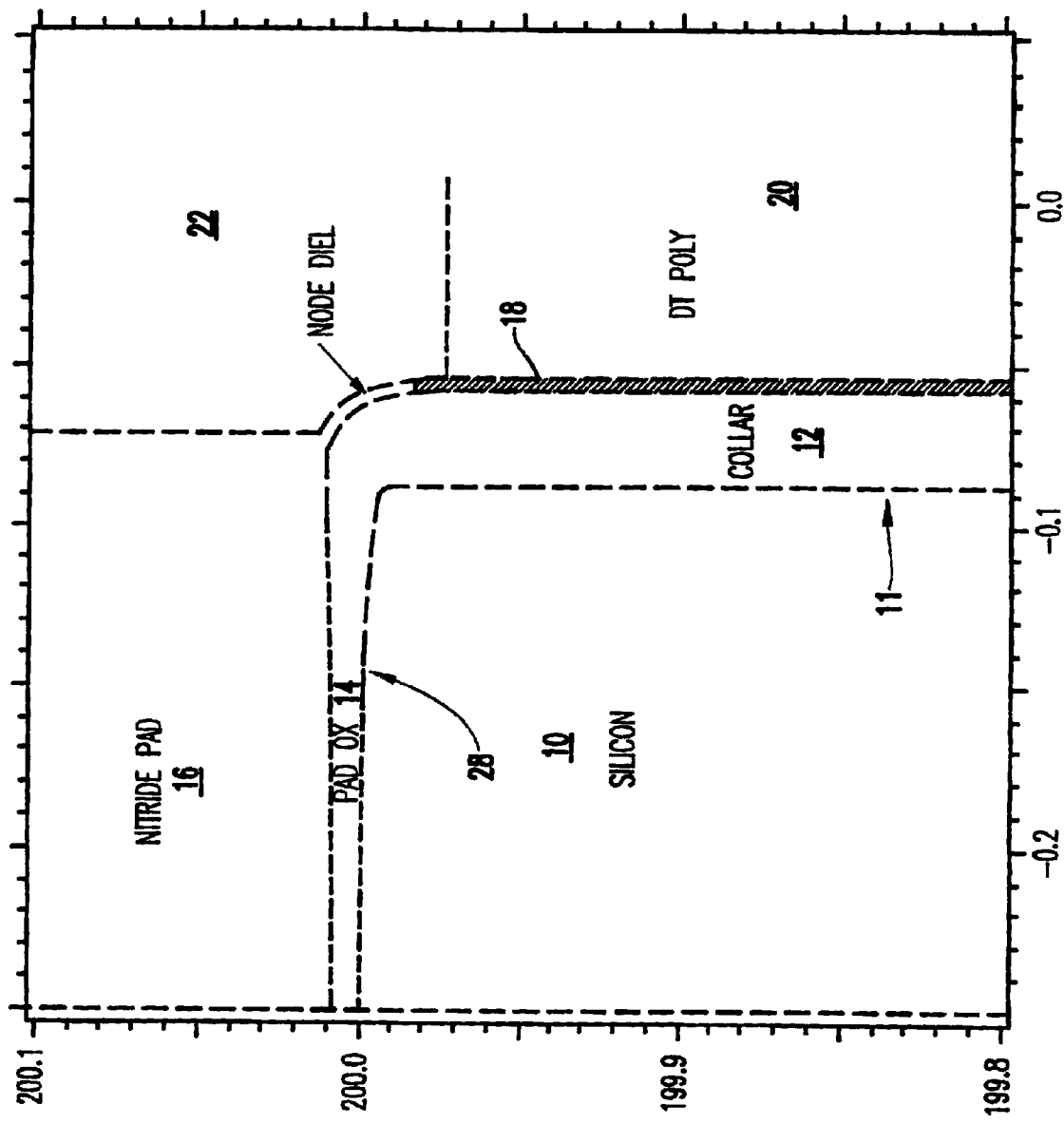
FIG. 1 is a schematic diagram depicting a DRAM structure in the formation of the invention.

Several embodiments of the invention are discussed below. A first embodiment is shown in FIGS. 1–6. Conventional DRAM processing well known to those ordinarily skilled in the art is performed until the structure depicted in FIG. 1 is formed. The structure includes a substrate 10 (e.g., silicon) having a trench 11 therein. The upper portion of the trench 11 includes an insulating collar 12 (e.g., such as an oxide). A pad oxide 14 extends horizontally from the collar 12 and is positioned between the substrate 10 and a pad 16 which is formed from, for example, silicon nitride. Lining the trench is a node dielectric 18 (e.g., silicon nitride). A conductor 20 (e.g., tungsten, polysilicon,) fills the trench 11.

A shallow recess 22 is formed in the conductor 20 down to approximately 20 nm below the upper level 28 of the substrate 10. The recess 22 prevents the conductor 20 from extending above the substrate 10 surface.

Figure 2:
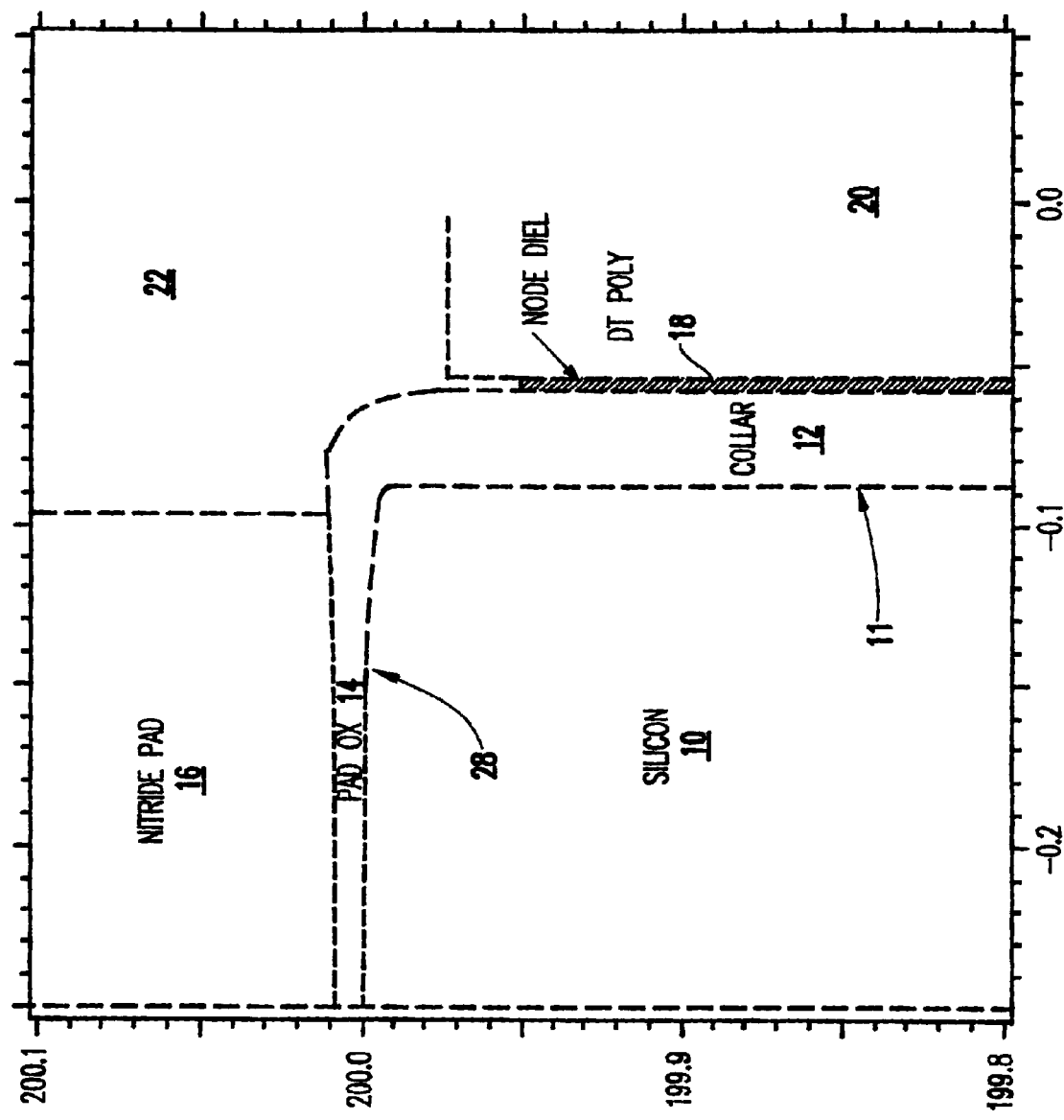
FIG. 2 is a schematic diagram depicting a DRAM structure in the formation of the invention;.
Figure 3:
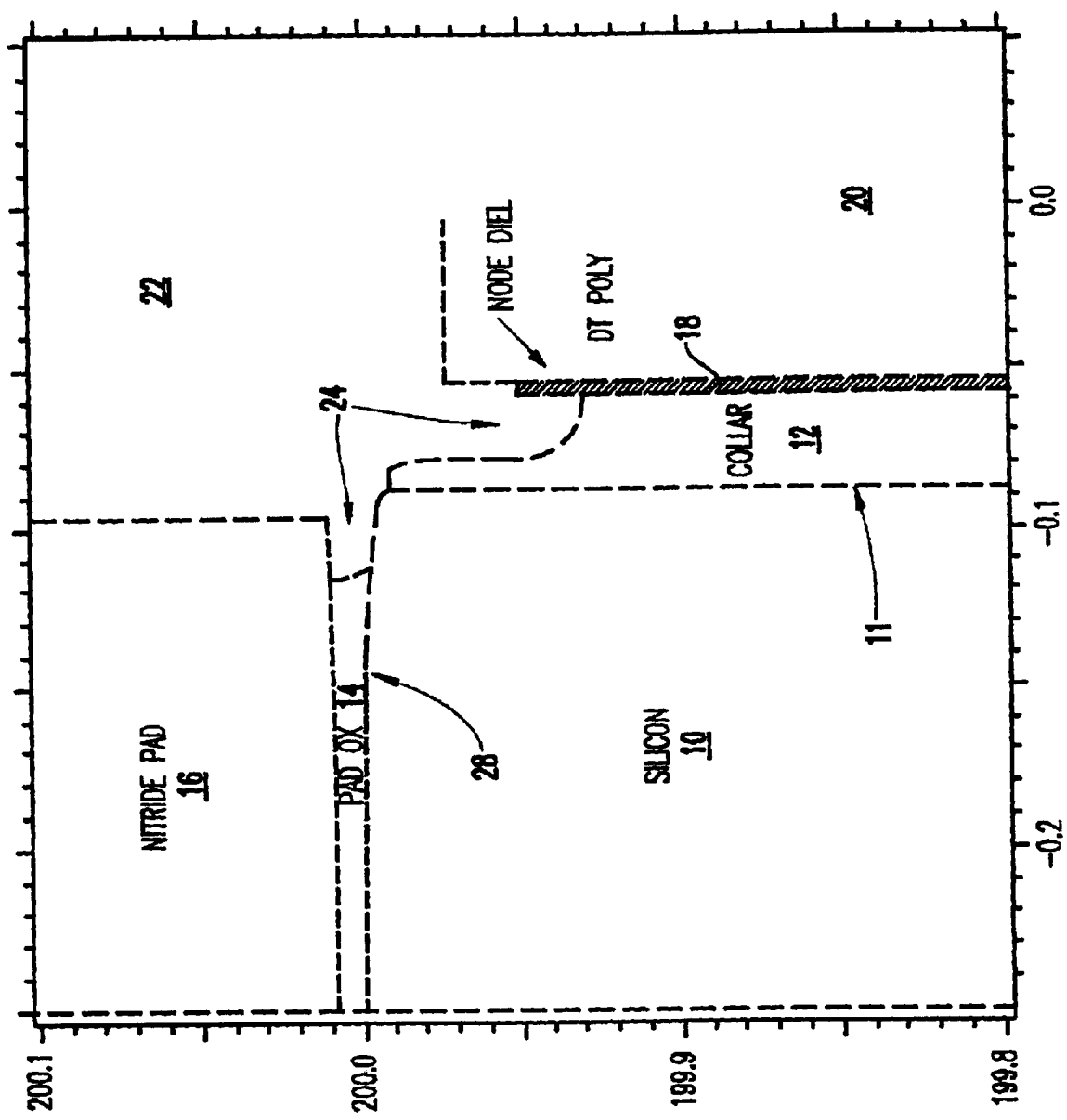
FIG. 3 is a schematic diagram depicting a section of the collar removed.

Initially, the invention pulls back (e.g., etches) the node dielectric 18 and the pad 16 so that the collar 12 is exposed, as shown in FIG. 2. While the figures illustrate a LOCOS collar, as would be known by one ordinarily skilled in the art, the invention may be easily extended to a conventional TEOS deposited collar. Then, as shown in FIG. 3, a strap recess 24 is formed using a wet etch. The oxide may also be etched with anisotropic Reactive Ion Etch (RIE) selective to the pad nitride (16) and silicon (20 and 10). In a preferred embodiment, the strap recess 24 encompasses approximately 20 nm in width and extends from the pad oxide 14 to below the top portion of the node dielectric 18. If the pad oxide 14 has sufficient thickness, the wet etch may create an undercut in the pad oxide 14. In any case, the subsequent fill process discussed below will completely fill any undercut.

Figure 4:
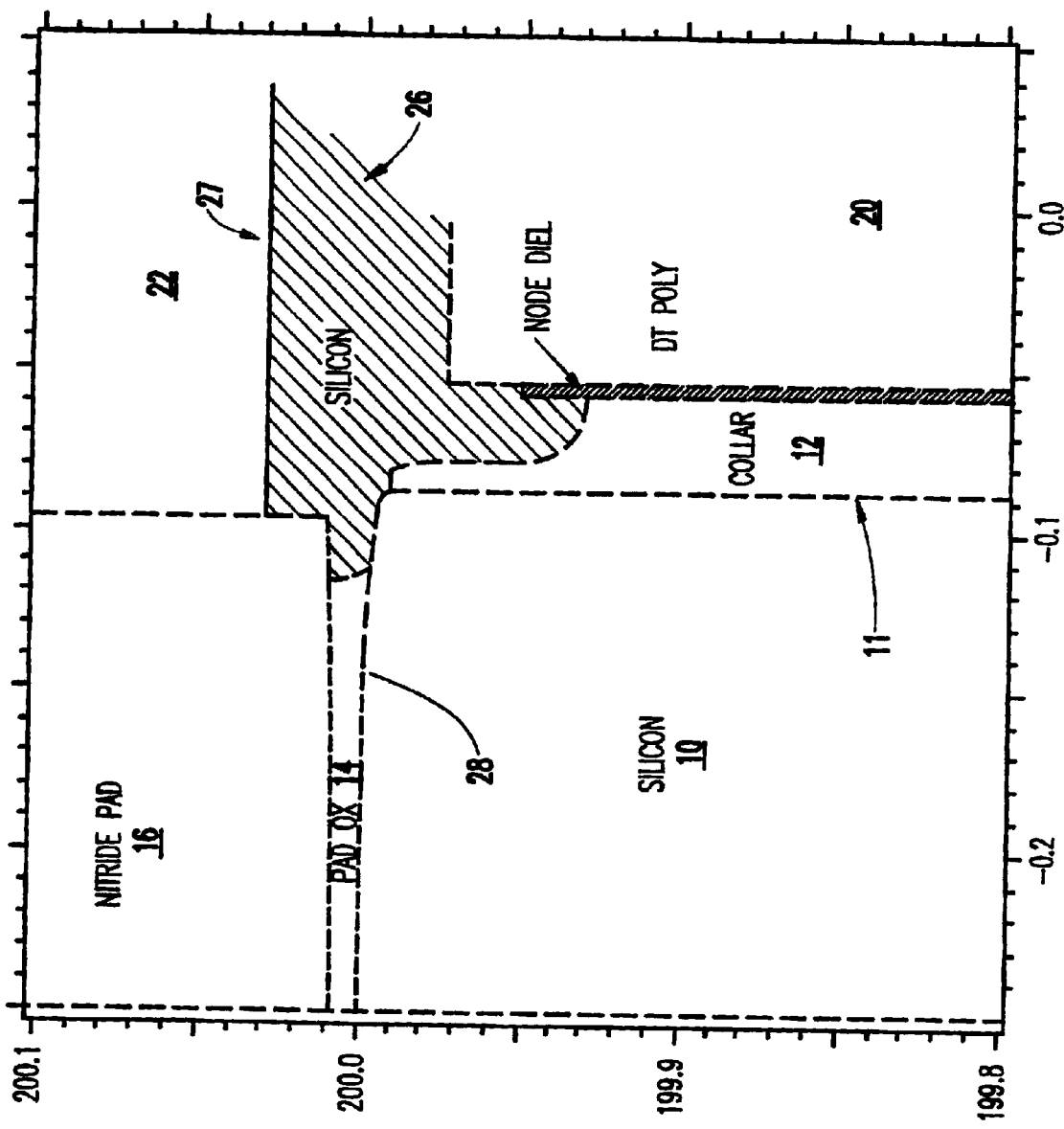
FIG. 4 is a schematic diagram depicting a near surface strap.

As shown in FIG. 4, the lip strap 26, which can be formed of any suitable conductor, such as polysilicon, tungsten, etc., is deposited and recessed below the pad 16 surface, and above the substrate surface 28. In a preferred embodiment, the "lip strap" 26 extends approximately 20 nm above the upper surface 28 of the substrate 10 as shown by item 27 in FIG. 4.

The shape/size of the lip strap 26 and its height 27 above the substrate surface 28 is governed by the recessing of the lip strap 26. In a preferred embodiment the height 27 of the strap recess is controlled to guarantee that the strap 26 is above the substrate surface 28. When determining the strap recess height 27, the pad 16 thickness variation is important and is considered by the invention. The appropriate strap recess height 27 may also be controlled using a layered deep trench hardmask process that preserves some oxide (e.g., in a LOCOS process), as would be known by one ordinarily skilled in the art given this disclosure.

Figure 5:
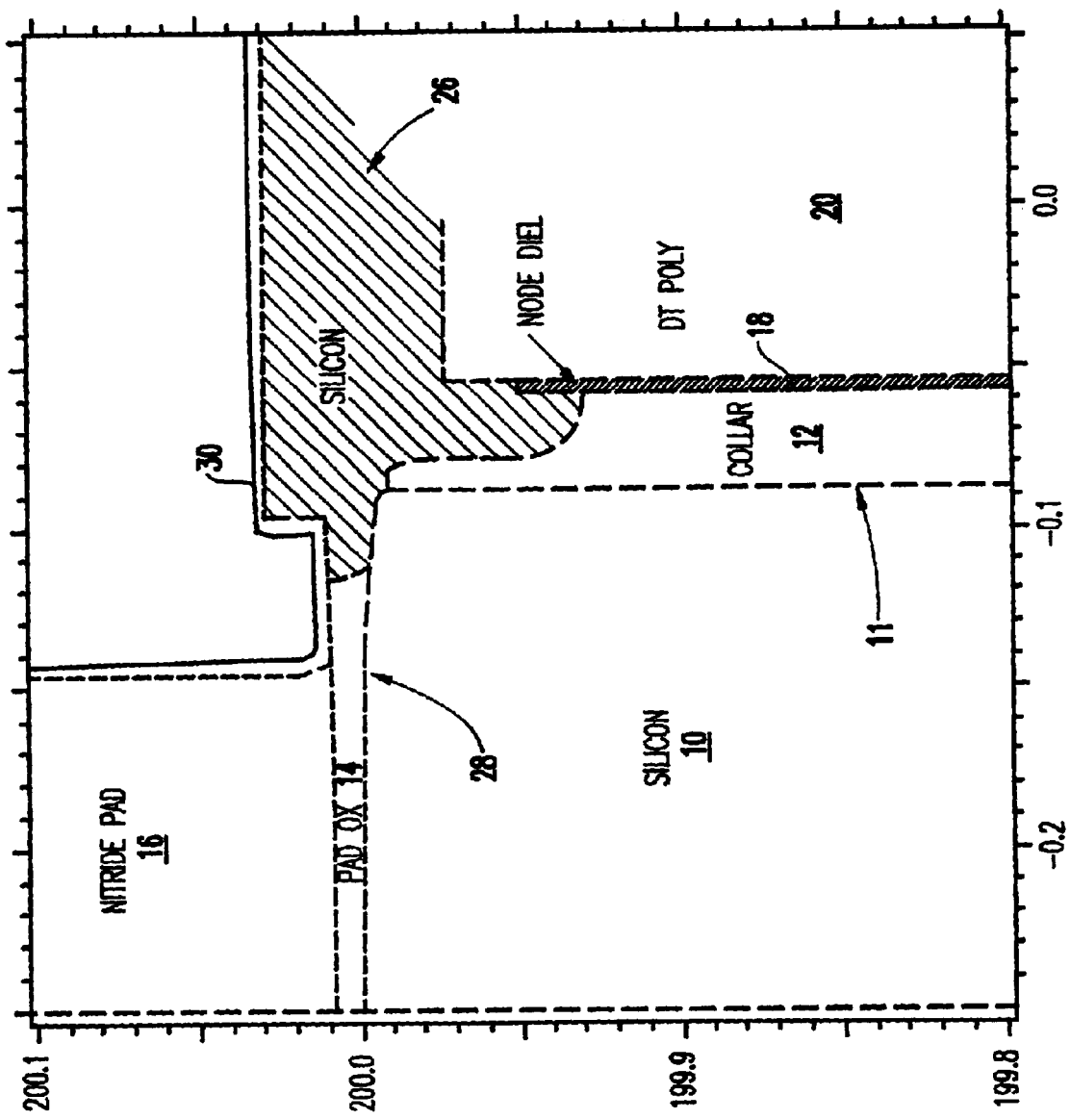
FIG. 5 is a schematic diagram depicting a layer of trench top oxide and pad pull back.

The pad is pulled back an additional amount as shown in FIG. 5, using similar processes as discussed above. In one embodiment, an optional thin trench top (TT) layer 30 (e.g., silicon nitride, etc.) may be deposited on the lip strap 26 to provide a margin for insulation from a passing gate (not shown) on the surface of the pads 16.

Figure 6:
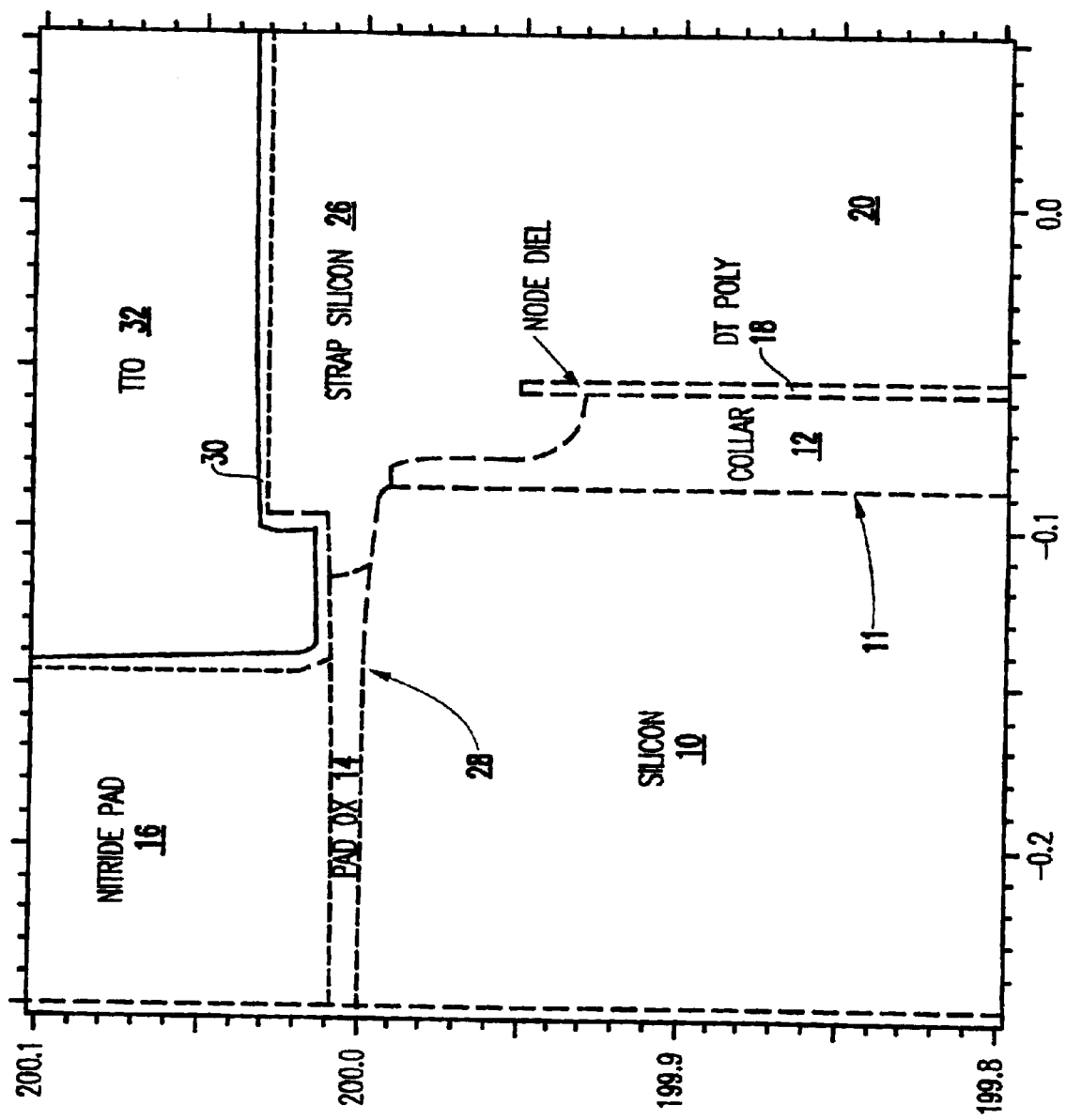
FIG. 6 is a schematic diagram depicting a completed structure according to the invention.

As shown in FIG. 6, a trench top oxide 32 such as tetraethylorthosilicate (TEOS), high density plasma (HDP) oxide, or other suitable insulator, is formed. The trench top oxide 32 is then polished using chemical mechanical polishing (CMP) or other suitable process to planarize the upper surface of the structure.

As would be apparent to one ordinarily skilled in the art given this disclosure, the structure can be completed and the active area can be defined using conventional shallow trench isolation (STI), raised shallow trench isolation (RSTI), local the oxidation of silicon (LOCOS), or other similar process.

Figure 7:
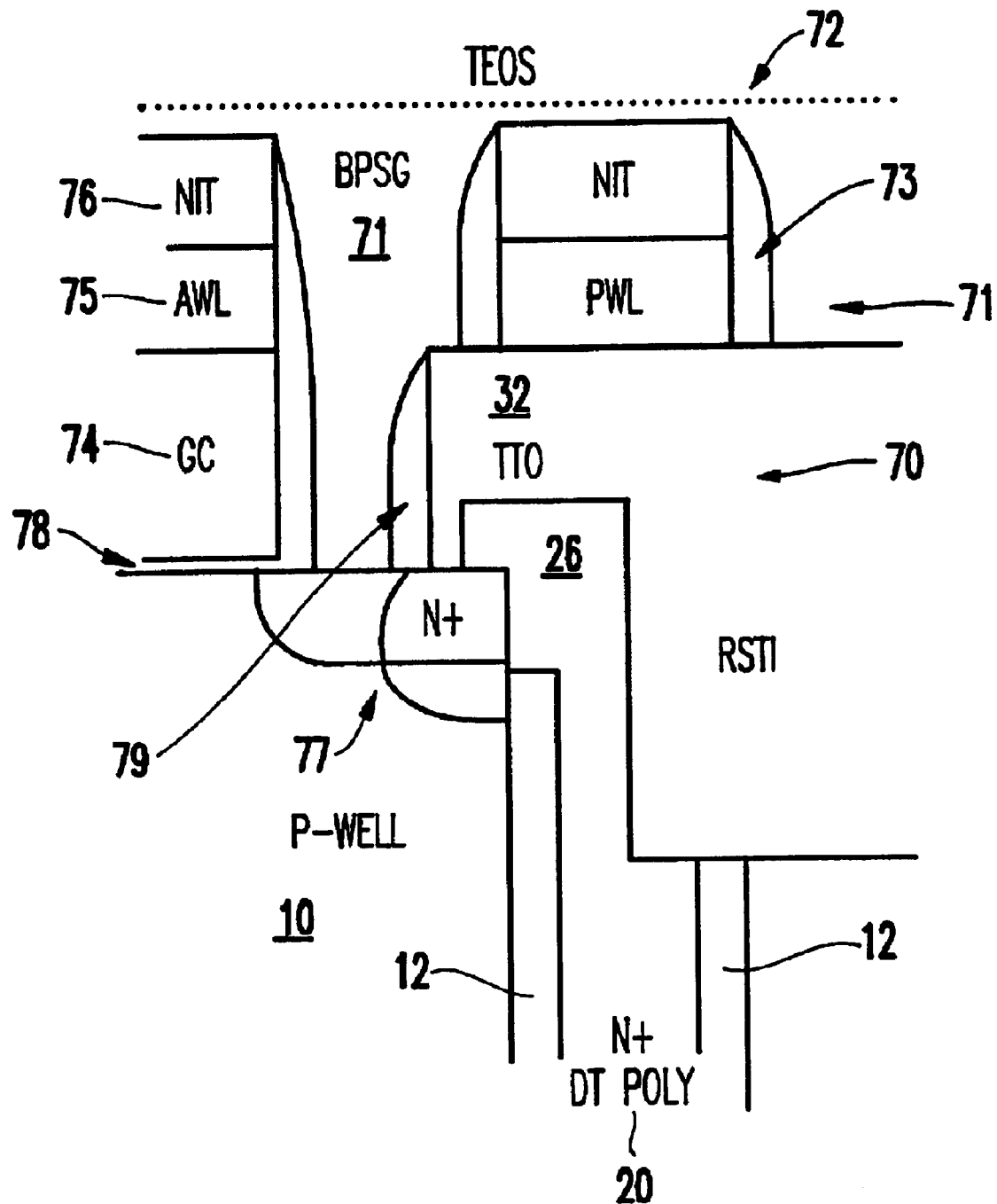
FIG. 7 is a schematic diagram depicting another lip strap according to the invention.

FIG. 7 illustrates one embodiment of the inventive structure after the formation of the isolation region and the gate conductor stacks. More specifically, FIG. 7 illustrates the lip strap 26, which is manufactured as discussed above. The resulting RSTI region 70 defines the active area and joins the TTO 32. The pad oxide 14 is replaced with a gate oxide 78, using processes well known to those ordinarily skilled in the art. The doped source/drain region is illustrated as item 77. Further, the gate conductor stacks include the gate conductor 74, the word line 75 and the nitride caps 76. An insulator 71 such as boron phosphorous silicate glass (BPSG) provides insulation and support. The structure is topped by another insulator, such as TEOS 72.

FIG. 7 also illustrates insulating spacers 73, 79. An important feature of the invention is that the insulating spacer 79 is formed adjacent to the TTO region 32. The spacer formation technology is well-known to those ordinarily skilled in the art and will not be discussed in detail here. However, the dielectric spacer 79 can be utilized in a number of different ways to produce different benefits for the invention. More specifically, in one embodiment, the spacers 79 can be formed after the gate sacrificial oxide is stripped and before the gate oxide 78 is grown.

Alternatively, the dielectric spacer 79 can be formed before the pad oxide 14 is stripped. This alternative process would allow the spacer 79 to be densified by the subsequent gate sacrificial oxide growth. This is especially true if the insulating spacer 79 is TEOS based. Further, in an additional embodiment, the spacer 79 could be made of phosphoro silicate glass (PSG) or doped glass. Therefore, in such a situation, the spacer 79 could provide additional dopants to the node junction if needed. Additionally, it is possible to form the spacer 79 as a doped glass spacer after the pad oxide 14 is removed. Then, the dopant could be driven into the node junction when the gate sacrificial oxide is grown. At this point, the doped insulator 79 could be replaced with a pure insulator, if desired.

It is to be noted that the structure in FIG. 7 may be achieved using several methods. For example, after the top of the trench is filled with TTO, the shallow trench isolation (STI) and fill processes are performed. The top of the trench may be filled concurrently as the STI. The pad nitride is then stripped, spacers 79 are formed, the gate sacrificial oxide is grown, implants performed, the sacrificial oxide is stripped, the gate oxide is grown, and the gate polysilicon is deposited and polished to the TTO (32). The rest of the gate stack is deposited and the rest of the processing is conventional.

In another example, the structure in FIG. 7 can be formed using the following process. After the top of the trench is filled with TTO as in FIG. 6, the pad nitride is stripped, spacers 79 are formed, the sacrificial oxide gate is grown, implants performed, the sacrificial oxide is stripped, the gate oxide is grown, and the gate polysilicon is deposited and polished to the TTO (32). A fresh pad nitride is then deposited and STI is formed and filled. The pad nitride is stripped, the rest of the gate slack is deposited and the conventional processing is then performed to complete the structure.

Figure 8:
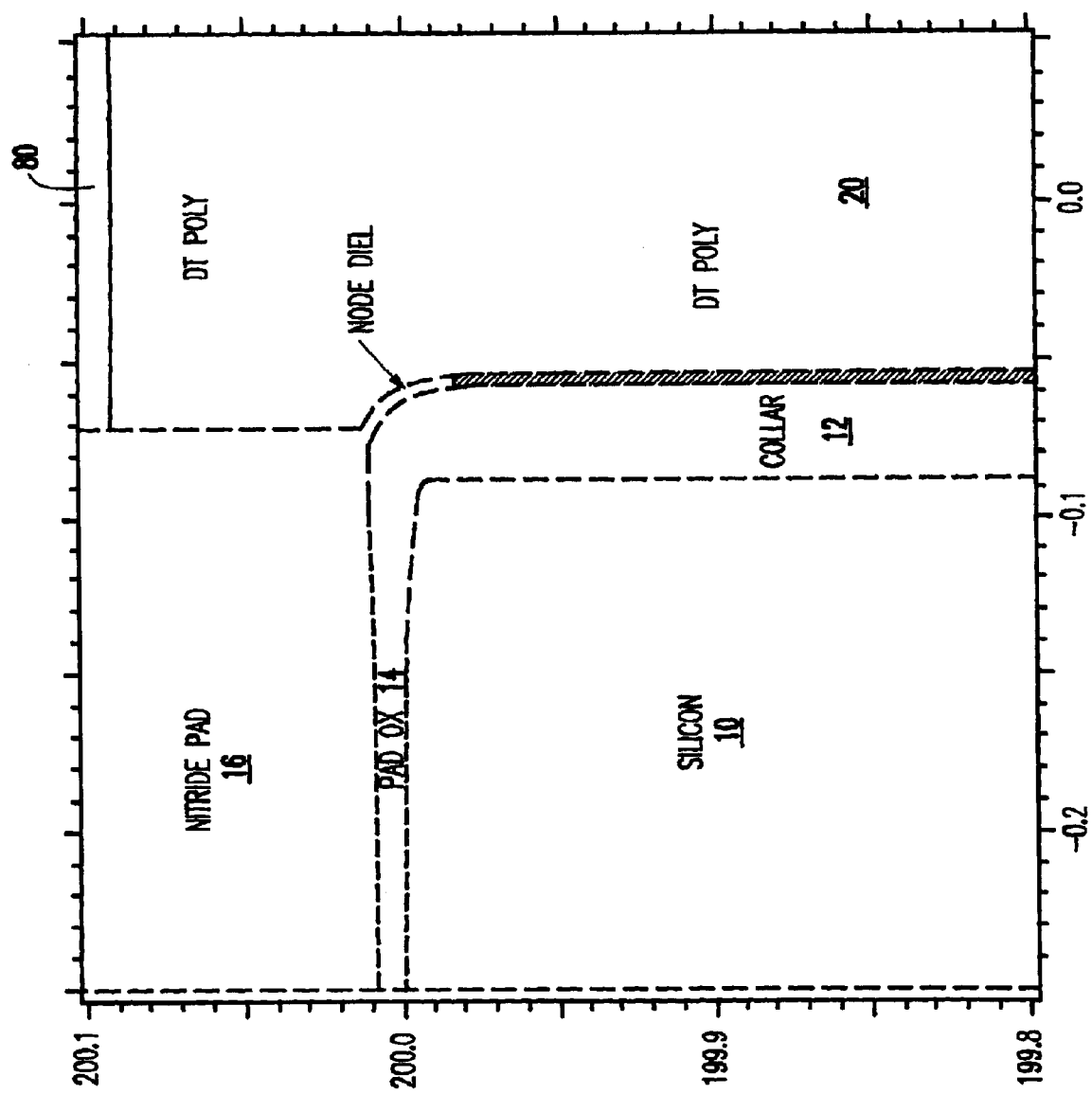
FIG. 8 is a schematic diagram depicting a different aspect of the invention.
Figure 9:
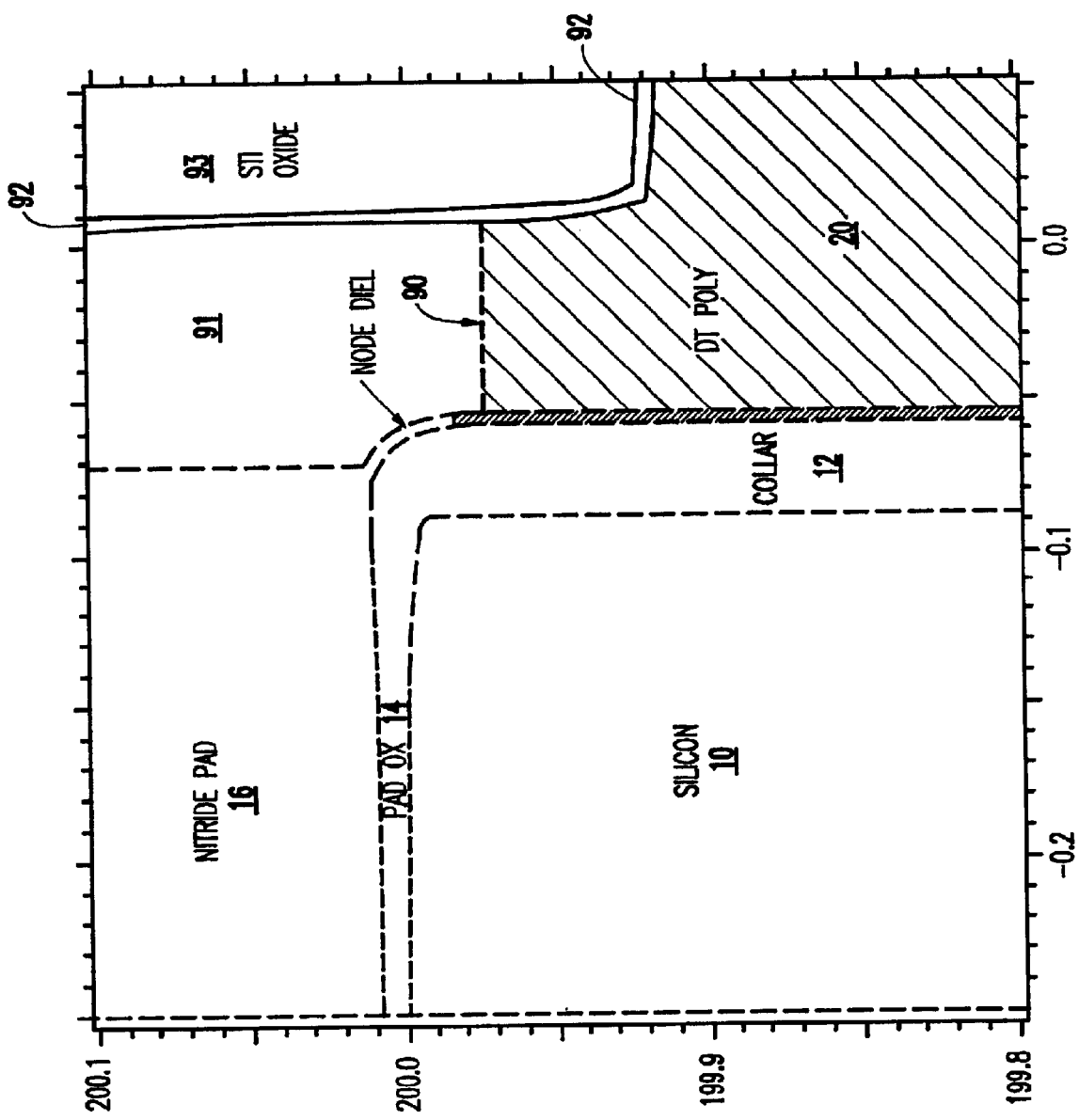
FIG. 9 is a schematic diagram depicting yet another aspect of the invention.

Another embodiment of the invention is illustrated in FIGS. 8 and 9. FIG. 8 illustrates a structure which is similar to that shown in FIG. 1; however, the conductor 20 is recessed slightly below the upper surface of the nitride pad 16, as shown by item 80. This is done to retain the conductor during the formation of the STI region 93. Then, as shown in FIG. 9, the shallow trench isolation region 93 (and optional liner 92) are formed using conventional processes and the processes discussed above. After the STI region 93 is formed, the conductor is recessed to level 90 and the lip strap 91 is formed, as discuss above.

Therefore, this embodiment of the invention is substantially similar to the previous embodiments. However, in this embodiment, the STI region is formed before the lip strap 91. By forming the lip strap 91 after the STI region 93, the number of thermal cycles which the lip strap 91 will receive is reduced. Each thermal cycle releases dopants from the conductive lip strap 91. By reducing the number of thermal cycles to which in the lip strap 91 is subjected, more doparts are retained within the lip strap 91. This makes the lip strap electrically shallower and increases the device performance accordingly.

Thus, as most clearly shown in FIG. 7, the invention is a dynamic random access memory device that includes a storage trench, a storage conductor 20 within the storage trench, a lip strap 26 connected to the storage conductor 20, and a control device 77 (e.g., transistor) electrically connected to the storage conductor 20 through the lip scrap 26. The lip strap 26 is a conductor that extends along a side of the trench and along a portion of the transistor conductive region (e.g., source/drain) and, therefore, surrounds a top corner of the trench. The lip strap 26 extends from a top of the collar 12 to a top of the trench and along a surface of the device adjacent the trench and perpendicular to the trench. In other words, the lip strap 26 extend along two perpendicular portions of the top corner of the trench.

As shown in FIG. 6, the lip strap 26 surrounds an upper portion of the node dielectric 18 adjacent the top portion of the trench 11. Also, the lip strap 26 extends into the trench top oxide 32 and forms an inverted U-shaped structure within the trench top oxide 32.

A major advantage of the last embodiment is that the buried strap 26 is formed after the AA oxidation and thus the invention has a reduced strap out diffusion. All of the embodiments of this invention protect the active silicon in the trench top region from the HDP oxide STI fill. Also, there is no risk of autodoping from the 'lip' to the neighboring active area with the invention. Further, with the invention, the lip strap 26 connection allows better control of leakage current and, as a result, is much more scalable. Further, the processing discussed above allows the lip strap 26 to be self-aligned, thereby avoiding inaccuracies and problems associated with lithographic techniques.

While the invention has been described in terms of preferred embodiments, those skilled in the art will recognize that the invention can be practiced with modification within the spirit and scope of the appended claims.

What is claimed is:

1. A method of forming a dynamic random access memory structure, said method comprising:
   forming a trench within a substrate;
   filling said trench with a trench conductor;
   forming a pad oxide along a surface of said substrate adjacent said trench;
   forming a collar along an upper portion of said trench such that said collar insulates said substrate from said trench conductor;
   recessing said collar and said pad oxide;
   depositing a lip strap over said trench conductor and in recesses produced by said recessing wherein said recessing allows a portion of said collar to remain in contact with the adjacent wall of said trench such that said collar separates said lip strap from said adjacent wall of said trench; and
   forming an isolation region adjacent said lip strap.

2. The method in claim 1, further comprising forming a control device adjacent said trench, wherein said trench has a corner adjacent said control device and said lip strap comprises a conductor surrounding said corner.

3. The method in claim 2, wherein said forming of said control device includes forming a control device conductive region adjacent said trench and said lip strap comprises a conductor formed along a side of said trench and along a portion of said control device conductive region.

4. The method in claim 1, further comprising forming a collar insulator along a top portion of said trench, wherein said lip strap comprises a conductor formed to extend from a top of said collar to a top of said trench, said lip strap further extending along a surface of said device adjacent said trench and perpendicular to said trench.

5. The method in claim 4, further comprising lining said trench with a node dielectric, wherein said lip strap surrounds an upper portion of said node dielectric adjacent said top portion of said trench.

6. The method in claim 1, further comprising forming a trench top oxide, such that said lip strip extend into said trench top oxide and forms an inverted U-shaped structure.

7. The method in claim 1, wherein said lip strap comprises a conductor formed along two perpendicular portions of a top corner of said trench.

8. A method of forming a dynamic random access memory structure, said method comprising:
   forming a trench within a substrate;
   filling said trench with a trench conductor;
   forming a pad oxide along a surface of said substrate adjacent said trench;
   forming a collar along an upper portion of said trench such that said collar insulates said substrate from said trench conductor;
   forming an isolation region adjacent said trench conductor;
   recessing said collar and said pad oxide; and
   depositing a lip strap over said trench conductor and in recesses produced by said recessing, wherein said recessing allows a portion of said collar to remain in contact with the adjacent wall of said trench such that said collar separates said lip strap from said adjacent wall of said trench.

9. The method in claim 8, further comprising forming a control device adjacent said trench, wherein said trench has a corner adjacent said control device and said lip strap comprises a conductor surrounding said corner.

10. The method in claim 9, wherein said forming of said control device includes forming a control device conductive region adjacent said trench and said lip strap comprises a conductor formed along a side of said trench and along a portion of said control device conductive region.

11. The method in claim 18, further comprising forming a collar insulator along a top portion of said trench, wherein said lip strap comprises a conductor formed to extend from a top of said collar to a top of said trench, said lip strap further extending along a surface of said device adjacent said trench and perpendicular to said trench.

12. The method in claim 8, further comprising lining said trench with a node dielectric, wherein said lip strap surrounds an upper portion of said node dielectric adjacent said top portion of said trench.

13. The method in claim 8, further comprising forming a trench top oxide, such that said lip strap extends into said trench top oxide and forms an inverted U-shaped structure.

14. A method of forming a dynamic random access memory structure, said method comprising:
   forming a trench within a substrate;
   filling said trench with a trench conductor;
   forming a pad oxide along a surface of said substrate adjacent said trench;
   forming a collar along an upper portion of said trench such that said collar insulates said substrate from said trench conductor;
   recessing said collar and said pad oxide; and
   depositing a lip strap over said trench conductor and in recesses produced by said recessing, wherein said recessing allows said collar to remain in contact with the adjacent wall of said trench such that said collar separates said lip strap from said adjacent wall of said trench.

15. The method in claim 14, further comprising forming a control device adjacent said trench, wherein said trench has a corner adjacent said control device and said lip strap comprises a conductor surrounding said corner.

16. The method in claim 15, wherein said forming of said control device includes forming a control device conductive region adjacent said trench and said lip strap comprises a conductor formed along a side of said trench and along a portion of said control device conductive region.

17. The method in claim 14, further comprising forming a collar insulator along a top portion of said trench, wherein said lip strap comprises a conductor formed to extend from a top of said collar to a top of said trench, said lip strap further extending along a surface of said device adjacent said trench and perpendicular to said trench.

18. The method in claim 17, further comprising lining said trench with a node dielectric, wherein said lip strap surrounds an upper portion of said mode dielectric adjacent said top portion of said trench.

19. The method in claim 14, further comprising forming a trench top oxide, such that said lip strap extends into said trench top oxide and forms an inverted U-shaped structure.

20. The method in claim 14, wherein said lip strap comprises a conductor formed along two perpendicular portions of a top corner of said trench.

* * * * *